United States Patent
Teva et al.

(10) Patent No.: US 10,128,385 B2
(45) Date of Patent: Nov. 13, 2018

(54) LATERAL SINGLE-PHOTON AVALANCHE DIODE AND METHOD OF PRODUCING A LATERAL SINGLE PHOTON AVALANCHE DIODE

(71) Applicant: ams AG, Unterpremstaetten (AT)

(72) Inventors: Jordi Teva, Veldhoven (NL); Frederic Roger, Graz (AT)

(73) Assignee: ams AG, Premstätten (AT)

( * ) Notice: Subject to any disclaimer, the term of this patent is extended or adjusted under 35 U.S.C. 154(b) by 318 days.

(21) Appl. No.: 14/654,470

(22) PCT Filed: Dec. 19, 2013

(86) PCT No.: PCT/EP2013/077423
§ 371 (c)(1),
(2) Date: Jun. 19, 2015

(87) PCT Pub. No.: WO2014/096210
PCT Pub. Date: Jun. 26, 2014

(65) Prior Publication Data
US 2015/0333210 A1    Nov. 19, 2015

(30) Foreign Application Priority Data

Dec. 21, 2012  (EP) .................................... 12199105

(51) Int. Cl.
*H01L 31/107*  (2006.01)
*H01L 31/0224*  (2006.01)
(Continued)

(52) U.S. Cl.
CPC ............... *H01L 31/022408* (2013.01); *H01L 31/02005* (2013.01); *H01L 31/0224* (2013.01);
(Continued)

(58) Field of Classification Search
CPC ...................................................... H01L 31/107
See application file for complete search history.

(56) References Cited

U.S. PATENT DOCUMENTS 7,462,889 B2   12/2008   Yagyu et al.
2007/0145411 A1  6/2007   Chen et al.
(Continued)

FOREIGN PATENT DOCUMENTS

| EP | 2355155 A2 | 8/2011 |
|---|---|---|
| EP | 2592661 A1 | 5/2013 |
| JP | S601866 A | 1/1985 |

*Primary Examiner* — Matthew Reames
*Assistant Examiner* — Christopher Culbert
(74) *Attorney, Agent, or Firm* — Fish & Richardson P.C.

(57) ABSTRACT

A semiconductor body of a first type of conductivity is formed including a base layer, a first further layer on the base layer and a second further layer on the first further layer. The base layer and the second further layer have an intrinsic doping or a doping concentration that is lower than the doping concentration of the first further layer. A doped region of an opposite second type of conductivity is arranged in the semiconductor body, penetrates the first further layer and extends into the base layer and into the second further layer. Anode and cathode terminals are electrically connected to the first further layer and the doped region, respectively. The doped region can be produced by filling a trench with doped polysilicon.

10 Claims, 2 Drawing Sheets

(51) Int. Cl.
*H01L 31/0248* (2006.01)
*H01L 31/18* (2006.01)
*H01L 31/0368* (2006.01)
*H01L 31/02* (2006.01)
*H01L 31/0352* (2006.01)

(52) U.S. Cl.
CPC .. *H01L 31/0248* (2013.01); *H01L 31/022416* (2013.01); *H01L 31/03529* (2013.01); *H01L 31/03682* (2013.01); *H01L 31/107* (2013.01); *H01L 31/182* (2013.01); *Y02E 10/50* (2013.01)

(56) References Cited

U.S. PATENT DOCUMENTS

| | | | |
|---|---|---|---|
| 2008/0067620 A1* | 3/2008 | Rothman | H01L 31/03529 257/438 |
| 2008/0067622 A1* | 3/2008 | Bui | H01L 27/1446 257/458 |
| 2008/0191240 A1 | 8/2008 | Yagyu et al. | |
| 2009/0016399 A1* | 1/2009 | Bowers | B82Y 20/00 372/50.21 |
| 2010/0148040 A1* | 6/2010 | Sanfilippo | H01L 31/1075 250/214.1 |
| 2011/0260277 A1* | 10/2011 | Rothman | B82Y 20/00 257/438 |
| 2012/0025340 A1 | 2/2012 | Park | |
| 2012/0193636 A1* | 8/2012 | Stern | H01L 27/1464 257/76 |

* cited by examiner

LATERAL SINGLE-PHOTON AVALANCHE DIODE AND METHOD OF PRODUCING A LATERAL SINGLE PHOTON AVALANCHE DIODE

BACKGROUND OF THE INVENTION

Single-photon avalanche diodes (SPAD), also called Geiger-mode avalanche photodiodes, are suitable to detect extremely weak radiation. Avalanche photodiodes having the pn junction biased in the reverse direction become conducting when the applied voltage exceeds a breakdown voltage. A single-photon avalanche diode is operated with reverse bias voltage above the breakdown voltage, in the so-called Geiger-mode. In this mode of operation the electric field strength in the space charge region can attain values of more than 500 kV/cm, so that already few electron-hole pairs generated by incident photons and injected into the depletion layer can trigger a self-sustaining avalanche current of several mA.

US 2012/0025340 A1 discloses a vertical silicon photomultiplier for Geiger-mode operation. A pattern of trench electrodes provides anodes and cathodes of a pixel array. A pn-junction layer is arranged at the walls of the cathodes.

US 2010/0148040 A1 discloses a single-photon avalanche diode comprising an n-type semiconductor body providing an active region including the cathode, a trench extending through the body around the active region and providing a laterally isolating region, a depletion region, and a p-type anode region at a surface of the active region.

U.S. Pat. No. 7,462,889 B2 discloses an avalanche photodiode with a ring shape trench region surrounding a light receiving region.

US 2008/0191240 A1 discloses an avalanche photodiode with an outer trench provided in the periphery of a light absorption layer surrounding the depletion region to interrupt the path of the dark current.

US 2007/0145411 A1 discloses a trench polysilicon diode.

For at least 30% of incoming radiation to be detected in the near infrared spectrum, at the wavelength of 800 nm, for example, the absorption region has to be about 7 µm thick. A fast response of the photodiode is achieved with a wide space charge region, which can unfortunately only be obtained in conventional single-photon avalanche diodes if the breakdown voltage of the pn-junction is increased to values much higher than the range from 20 V to 40 V of the voltages that are preferably applied. If the breakdown voltage is sufficiently low to allow Geiger-mode operation even in this low voltage range, the dimension of the space charge region is limited to the range from ca. 0.7 µm to ca. 1.5 µm, and only about 10% of the radiation having the wavelength of 800 nm is absorbed.

SUMMARY OF THE INVENTION

The lateral single-photon avalanche diode comprises a semiconductor body of a first type of conductivity, a pn-junction, an anode terminal and a cathode terminal. The semiconductor body includes a base layer of semiconductor material, a first further layer of semiconductor material on the base layer and a second further layer of semiconductor material on the first further layer. The base layer and the second further layer have an intrinsic doping or a lower doping concentration than the first further layer. A doped region of a second type of conductivity, which is opposite to the first type of conductivity, is arranged in the semiconductor body, penetrates the first further layer and extends into the base layer and into the second further layer. The anode and cathode terminals are each electrically connected to one of the first further layer and the doped region, respectively.

In an embodiment of the lateral single-photon avalanche diode the first further layer is a first epitaxial layer grown on the base layer, and the second further layer is a second epitaxial layer grown on the first further layer.

In a further embodiment the first further layer comprises a doping concentration in the range from $10^{17}$ cm$^{-3}$ to $10^{18}$ cm$^{-3}$, and the base layer and the second further layer comprise a doping concentration below $10^{15}$ cm$^{-3}$. The doping concentration of the first further layer is selected to achieve the desired breakdown voltage.

In a further embodiment the first further layer has a thickness in the range from 5 µm to 20 µm, and the base layer and the second further layer each have a thickness of less than 2 µm.

In a further embodiment the doped region comprises doped polysilicon.

In a further embodiment, one of the anode and cathode terminals is a metal plug arranged in the doped region, and the other one is arranged surrounding the doped region at a distance.

In a further embodiment the semiconductor body is bonded to a further semiconductor body comprising an integrated circuit, and terminals of the integrated circuit are connected with the anode and cathode terminals.

In a further embodiment at least an antireflective coating and/or a filter layer are/is arranged on or above the semiconductor body opposite the further semiconductor body, i. e., on the side facing away from the further semiconductor body. An electrically conductive redistribution layer is arranged on or above the further semiconductor body opposite the semiconductor body. A through-substrate via connects the integrated circuit with the redistribution layer.

In a further embodiment the pn-junction has a reverse bias breakdown voltage below 40 V.

The method of producing a lateral single-photon avalanche diode first provides a semiconductor body with a first type of conductivity, including a base layer of semiconductor material, a first further layer of semiconductor material on the base layer and a second further layer of semiconductor material on the first further layer. A trench is formed in the semiconductor body, so that the trench penetrates the second further layer and the first further layer and extends into the base layer. The trench is filled with an electrically conductive material doped for a second type of conductivity, which is opposite to the first type of conductivity, thus forming a doped region. Anode and cathode terminals are formed, so that one of them is arranged in the electrically conductive material of the trench and the other one is arranged in the semiconductor body outside the trench at a distance from the trench.

In a variant of the method any edges of the doped region are arranged at a distance from the first further layer.

In a further variant of the method the electrically conductive material filling the trench is doped polysilicon.

In a further variant of the method the doped polysilicon is in-situ doped polysilicon deposited by low-pressure chemical vapor deposition.

In a further variant of the method the polysilicon is annealed, thus forming a pn-junction at a distance from the trench.

In a further variant of the method the first further layer is formed by an epitaxial growth on the base layer, and the second further layer is formed by an epitaxial growth on the first further layer.

The following is a detailed description of examples of the lateral single-photon avalanche diode and the appertaining method of producing a lateral single-photon avalanche diode.

DETAILED DESCRIPTION

Figure 1:
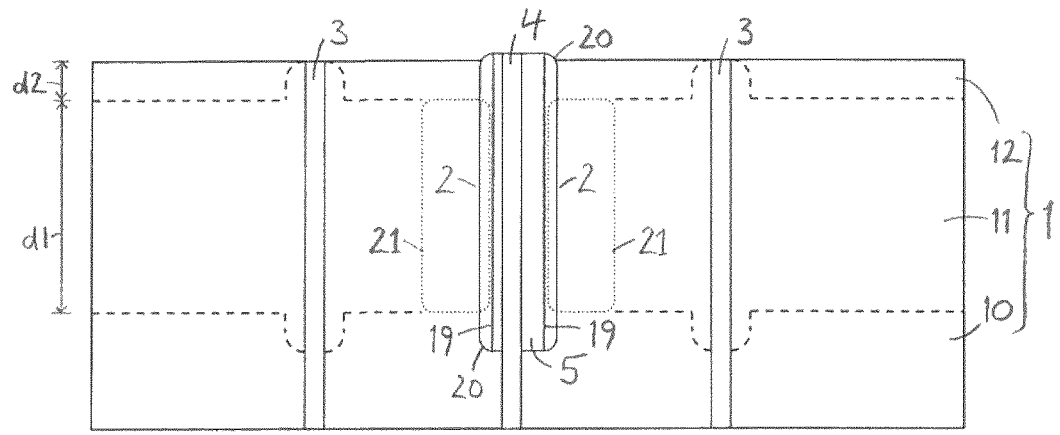
FIG. 1 is a schematic cross section of an embodiment of the lateral single-photon avalanche diode.

FIG. 1 is a schematic cross section of the main structure of the lateral single-photon avalanche diode. A semiconductor body 1, which may be silicon, for instance, has a first type of conductivity and comprises at least a base layer 10, which may be a silicon substrate, for instance, or an epitaxial layer grown on a highly doped substrate, a first further layer 11 and a second further layer 12. The first further layer 11 and the second further layer 12 may be grown epitaxially on the base layer 10. The first further layer 11 has a higher doping concentration than the base layer 10 and the second further layer 12. If the doping concentration of the first further layer 11 is in the range from $10^{17}$ cm$^{-3}$ to $10^{18}$ cm$^{-3}$, for example, the base layer 10 and the second further layer 12 may comprise a doping concentration below $10^{15}$ cm$^{-3}$, for example. The base layer 10 and the second further layer 12 may instead only comprise an intrinsic doping. The thickness of the first further layer 11 is indicated in FIG. 1 as a first dimension d1, which may be in the range from 5 µm to 20 µm, for example, and the thickness of the second further layer 12 is indicated as a second dimension d2, which may typically be smaller than 2 µm, for example.

A pn-junction 2 is formed between the region of the first type of conductivity of the semiconductor body 1 and a doped region 5 having a second type of conductivity opposite to the first type of conductivity. An anode terminal 3 is provided in the p-type region, and a cathode terminal 4 is provided in the n-type region. FIG. 1 shows an embodiment in which the first type of conductivity is p-type conductivity and the second type of conductivity is n-type conductivity. The anode terminal 3 is arranged extending through the first layer 11, and the cathode terminal 4 is arranged in the doped region 5. The anode terminal 3 and the cathode terminal 4 may be formed by plugs, which may comprise a metal, for instance. Although it may be favorable to use a conventional semiconductor substrate that is doped for p-type conductivity as the base layer 10, the conductivity types may instead be reversed, and in this case the functions of the terminals as anode and cathode are reversed accordingly.

FIG. 1 shows that upper and lower edges 20 of the doped region 5 are located outside the level of the first further layer 11. Because the doping concentration of the first further layer 11 is higher than the doping concentration of the adjacent layers 10, 12, the region of high electric field or avalanche region 21 that is generated at the pn-junction 2 is essentially confined to the first further layer 11, as shown in FIG. 1. If a trench 19 is etched in the semiconductor body 1 to produce the doped region 5, as will be described below in detail, the pn-junction 2 may be shifted away from the trench 19, so that the space charge region does not encompass the sidewall of the trench 19. The boundaries between lower and higher doping concentrations are indicated with broken lines in FIG. 1.

Figure 2:
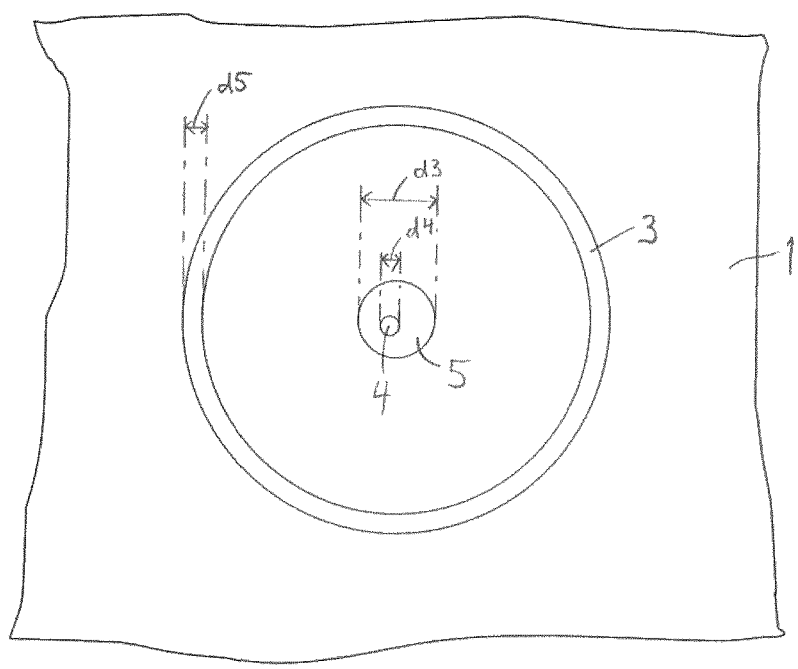
FIG. 2 is a schematic plan view of the arrangement of the anode and cathode terminals.

FIG. 2 is a schematic plan view of the upper surface of the embodiment according to FIG. 1. The cathode terminal 4 is arranged in the doped region 5 and is surrounded by the anode terminal 3. The lateral boundaries of the anode terminal 3 have cylindrical shapes of different diameters and are concentric. The arrangement of the anode terminal 3 may be different from the example shown in FIG. 2. The diameter of the doped region 5, indicated as a third dimension d3 in FIG. 2, may be smaller than 2 µm, if the diameter of the cathode terminal 4, indicated as a fourth dimension d4, is not larger than ca. 1 µm, for example. The distance between the inner and outer boundaries of the anode terminal 3, indicated as a fifth dimension d5, may be as large as the dimension d4. The anode terminal 3 as shown in FIG. 2 may serve to surround and thus define the area of one pixel of an array of photodiodes formed by a plurality of single-photon avalanche diodes as described.

Figure 3:
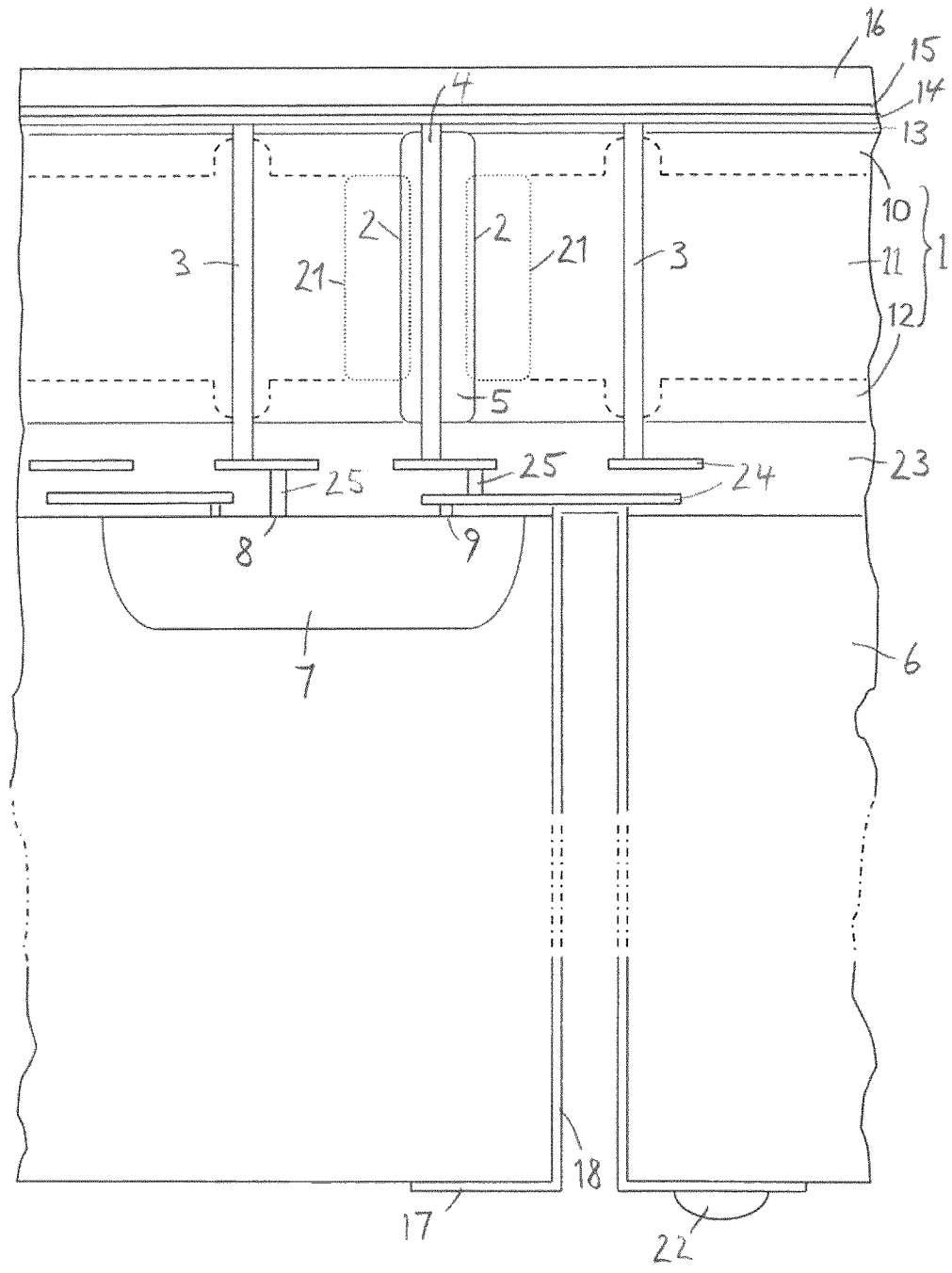
FIG. 3 is a cross section of a further embodiment of the lateral single-photon avalanche diode.

FIG. 3 is a cross section of an example of a three-dimensional integration of an embodiment of the lateral single-photon avalanche diode with a further device comprising an integrated circuit. The elements shown in FIG. 3 that correspond to similar elements shown in FIG. 1 are designated with the same reference numerals. The device comprising the single-photon avalanche diode is bonded to a further semiconductor body 6 comprising the integrated circuit 7, which may be a CMOS circuit, for instance. The semiconductor body 1 of the single-photon avalanche diode may be arranged with the second further layer 12 facing the further semiconductor body 6. The base layer 10 may be thinned, so that the base layer 10 and the second further layer 12 may have the same thickness, at least approximately.

A dielectric 23 may be used to connect the semiconductor bodies 1, 6. This may be done by a wafer-to-wafer bonding process, for example, which is known per se. Metal layers 24, which are vertically connected by plugs 25, may be embedded in the dielectric 23 to form a wiring. The anode terminal 3 of the single-photon avalanche diode may be electrically connected with a terminal 8 of the integrated circuit 7, and the cathode terminal 4 may be electrically connected with a further terminal 9 of the integrated circuit 7 by means of the wiring.

The surface of the semiconductor body 1 on the side opposite the further semiconductor body 6 is provided for the incidence of radiation. This surface is optionally covered with a sequence of layers, which may comprise a dielectric layer 13, especially a layer of SiO$_2$, disposed immediately on the surface of the semiconductor material, a protection layer 14, an antireflective coating layer 15 and/or a filter layer 16 like an infrared filter layer, for example. Any other layers that are used with conventional photodiodes, especially in order to adapt the optical properties of the photodiode to the intended applications, may be applied as well.

The surface of the further semiconductor body 6 on the side opposite the semiconductor body 1 may carry a redistribution layer 17 formed by conductor tracks, which are connected to terminals 8, 9 of the integrated circuit 7 and/or to one or both of the anode and cathode terminals 3, 4 by at least one through-substrate via 18. One or more contact pads, which may be supplied with a solder ball 22, may be provided on the redistribution layer 17 for external connection. If such a redistribution layer 17 is provided, the opposite surface can be kept free from the wiring and can hence entirely be used for the detection of radiation.

The single-photon avalanche diode comprising a lateral pn-junction offers the possibility of having a deep drift region with a relatively small breakdown voltage. The space charge region mainly extends in the direction perpendicular to the surface of incidence of radiation, and its depth in the semiconductor body is designed to have the desired dynamic efficiency. The quantum efficiency per unit area is enhanced in comparison with a conventional planar diode having a space charge region extending parallel to the surface, in particular when working with relatively long wavelengths (>670 nm). The lateral dimension of the described single-photon avalanche diode is essentially determined by the lateral dimension of the space charge region.

The single-photon avalanche diode provides an essentially uniform electric field and avoids the occurrence of a premature breakdown at the upper and lower edges of the doped region. The generated electric field is parallel to the surface of the device and is mainly localized near the central layer portion of the semiconductor body 1, owing to the doping profile. This may be achieved by the use of a semiconductor body 1 as described, which may be produced by two consecutive epitaxial layer depositions on a semiconductor substrate comprising an intrinsic doping or a low basic doping of typically $6 \times 10^{14}$ cm$^{-3}$ to $7 \times 10^{14}$ cm$^{-3}$. The first epitaxial layer 11 is provided with a higher doping concentration of the same type of conductivity, typically in the range from $10^{17}$ cm$^{-3}$ to $10^{18}$ cm$^{-3}$, which is suitable to promote an avalanche at a lower breakdown voltage. The first epitaxial layer 11 may be grown to a thickness of typically 5 μm to 20 μm, for example. A second epitaxial layer 12 is grown on the first epitaxial layer 11 to a thickness of typically 1 μm, for example. The second epitaxial layer 12 may have the same or about the same doping concentration as the substrate that is used as the base layer 10, for example, and has the same type of conductivity.

A trench 19 is etched through the epitaxial layers 11, 12 at least until the base layer 10 is reached. The depth of the trench 19 is controlled during the etching process, so that the edges 20 at the bottom of the trench 19 will be located outside the first epitaxial layer 11. The edges 20 are thus arranged outside the regions of high doping concentration, which may also include a p$^{++}$ substrate layer located under the base layer 10, for example, if the base layer 10 is an epitaxial layer.

The doped region 5 can be formed within the trench 19 by a deposition of an in-situ doped polysilicon layer, for instance, which may be performed using LPCVD (low-pressure chemical vapor deposition). The breakdown voltage is determined by the doping concentration of the polysilicon and the first epitaxial layer 11. To obtain a breakdown voltage of ca. 20 V, the doping concentration of the first epitaxial layer 11 should be at least $10^{17}$ cm$^{-3}$. The doped region 5 can instead be formed by epitaxial deposition of highly doped silicon, which is particularly n-type if the doped region 5 is provided as the cathode.

The sidewall of the trench 19, even if it has been smoothed, could have defects causing an increase of the dark current. The pn-junction 2 can be shifted from the trench 19 by an annealing step performed after the deposition of the polysilicon. A location that is intended for the region of high electric field or avalanche region 21 is thus provided at a position remote from the trench 19. A diffusion of dopants out of the first epitaxial layer 11 into regions located around the upper and lower portions of the doped region 5 should however be avoided in order to prevent an increase of the breakdown voltage at the edges 20.

A three-dimensional integration is particularly appropriate for a connection of the photodiode with a CMOS circuitry. In some applications like time-resolved single-photon detection systems, for example, the time response of the single-photon avalanche diode is critical. Therefore the resistance and capacitance of both the anode and the cathode should be reduced as much as possible. This is achieved with the application of metal plugs forming the anode and cathode terminals 3, 4 of the single-photon avalanche diode as shown in the described embodiments. Additionally, the plugs provide optical isolation between adjacent pixels. When an avalanche has been triggered in one pixel during the operation of the device, photons are emitted and could trigger an avalanche in adjacent pixels, thus degrading the performance of the system, especially the resolution of the array. It becomes increasingly important to avoid this kind of crosstalk when the area of the pixels is reduced and the pitch of the array is decreased.

The single-photon avalanche diode has several advantages, among them the advantage that the absorption of infrared wavelengths is increased without increasing the breakdown voltage of the diode. By introducing a starting material based on a multi-epitaxial layer stack, the breakdown voltage region is localized away from the trench edges, ensuring a proper Geiger-mode operation. The electric field is constant at the level of the second epitaxial layer, which ensures that the avalanche is triggered independently of the depth where the electron-hole pair is generated. The double-side trench structure allows to have a low resistive and a low capacitive connection between the single-photon avalanche diode and the CMOS circuitry. The breakdown voltage of the structure can be defined by adjusting the doping concentration of the second epitaxial layer. The single-photon avalanche diode and the CMOS circuitry are connected by a low-resistive and low-capacitive connection ensuring a very good performance for time-resolved single-photon applications. Furthermore, the connecting plugs provide optical isolation between adjacent pixels.

The invention claimed is:

1. A lateral single-photon avalanche diode, comprising:
   a semiconductor body of a first type of conductivity;
   a pn-junction;
   anode and cathode terminals;
   the semiconductor body including a base layer of semiconductor material, a first further layer of semiconductor material on the base layer and a second further layer of semiconductor material on the first further layer;
   the base layer and the second further layer having an intrinsic doping or a doping concentration that is lower than a doping concentration of the first further layer;
   a doped region of a second type of conductivity, which is opposite to the first type of conductivity, being arranged in the semiconductor body, penetrating the first further layer and extending into the base layer and into the second further layer; and
   the anode and cathode terminals each being electrically connected to one of the first further layer and the doped region, respectively,
   wherein the first further layer is an intermediate layer between the base layer and the second further layer, and
   wherein each of the base layer, the first further layer and the second further layer comprises the first type of conductivity.

2. The lateral single-photon avalanche diode according to claim 1, wherein the first further layer is a first epitaxial layer grown on the base layer, and
 wherein the second further layer is a second epitaxial layer grown on the first further layer.

3. The lateral single-photon avalanche diode according to claim 1, wherein the first further layer comprises a doping concentration in the range from $10^{17}$ cm$^{-3}$ to $10^{18}$ cm$^{-3}$, and
 wherein the base layer and the second further layer comprise a doping concentration below $10^{15}$ cm$^{-3}$.

4. The lateral single-photon avalanche diode according to claim 1, wherein the first further layer has a thickness in the range from 5 μm to 20 μm, and
 wherein the base layer and the second further layer each have a thickness of less than 2 μm.

5. The lateral single-photon avalanche diode according to claim 1, wherein the doped region comprises doped polysilicon.

6. The lateral single-photon avalanche diode according to claim 1, wherein one of the anode and cathode terminals is a metal plug arranged in the doped region, and
 wherein the other one of the anode and cathode terminals is arranged surrounding the doped region at a distance.

7. The lateral single-photon avalanche diode according to claim 1, further comprising:
 the semiconductor body being bonded to a further semiconductor body comprising an integrated circuit; and
 terminals of the integrated circuit being connected with the anode and cathode terminals.

8. The lateral single-photon avalanche diode according to claim 7, further comprising:
 at least one of an antireflective coating and a filter layer arranged on or above the semiconductor body opposite the further semiconductor body;
 an electrically conductive redistribution layer arranged on or above the further semiconductor body opposite the semiconductor body; and
 a through-substrate via connecting the integrated circuit with the redistribution layer.

9. The lateral single-photon avalanche diode according to claim 1, wherein the pn-junction has a reverse bias breakdown voltage below 40 V.

10. A lateral single-photon avalanche diode, comprising:
 a semiconductor body of a first type of conductivity;
 a pn-junction;
 the semiconductor body including a base layer of semiconductor material, a first further layer of semiconductor material on the base layer and a second further layer of semiconductor material on the first further layer;
 a doped region of a second type of conductivity, which is opposite to the first type of conductivity, being arranged in the semiconductor body, the doped region penetrating the first further layer and extending into the base layer and into the second further layer;
 an edge of the doped region, the edge being arranged at a distance from the first further layer; and
 anode and cathode terminals, one of the terminals being electrically connected to the first further layer and the other one of the terminals being electrically connected to the doped region,
 wherein the first further layer is an intermediate layer between the base layer and the second further layer, and
 wherein each of the base layer, the first further layer and the second further layer comprises the first type of conductivity.

* * * * *